US011567827B2

United States Patent
Zheng et al.

(10) Patent No.: US 11,567,827 B2
(45) Date of Patent: Jan. 31, 2023

(54) FAULT TOLERANT COMPUTATION METHOD AND APPARATUS FOR QUANTUM CLIFFORD CIRCUIT, DEVICE, AND CHIP

(71) Applicant: Tencent Technology (Shenzhen) Company Limited, Guangdong (CN)

(72) Inventors: Yicong Zheng, Guangdong (CN); Shengyu Zhang, Guangdong (CN)

(73) Assignee: Tencent Technology (Shenzhen) Company Limited, Shenzhen (CN)

( * ) Notice: Subject to any disclaimer, the term of this patent is extended or adjusted under 35 U.S.C. 154(b) by 182 days.

(21) Appl. No.: 17/167,932

(22) Filed: Feb. 4, 2021

(65) Prior Publication Data
US 2021/0224150 A1 Jul. 22, 2021

Related U.S. Application Data

(63) Continuation of application No. PCT/CN2020/124258, filed on Oct. 28, 2020.

(30) Foreign Application Priority Data
Jan. 17, 2020 (CN) .......................... 202010053343.X

(51) Int. Cl.
G06F 11/00 (2006.01)
G06F 11/30 (2006.01)
(Continued)

(52) U.S. Cl.
CPC ......... G06F 11/1044 (2013.01); G06N 10/00 (2019.01); G06N 10/70 (2022.01)

(58) Field of Classification Search
CPC ......... G06F 11/00; G06F 11/30; G08C 25/00; H03M 13/00; H04L 1/00
See application file for complete search history.

(56) References Cited

U.S. PATENT DOCUMENTS 10,535,809 B1 1/2020 Vodrahalli
2011/0138344 A1 6/2011 Ahn

FOREIGN PATENT DOCUMENTS

CN 103942460 A 7/2014
CN 106164942 A 11/2016
(Continued)

OTHER PUBLICATIONS

Chamberland et al. Fault-tolerant quantum computing in the Pauli or Clifford frame with slow error diagnostics, publcation Dec. 2017, quantum Dec. 23, 2017, pp. 1-11.*
Office Action issued on European Application 20859649.4 dated Apr. 12, 2022, 14 pages.
Zheng, Yi-Cong et al., "Depth reduction for quantum Clifford circuits through Pauli measurements", Centre for Quantum Technologies, National University of Singapore, Singapore 117543, May 31, 2018.
(Continued)

*Primary Examiner* — Samir W Rizk
(74) *Attorney, Agent, or Firm* — Crowell & Moring LLP

(57) ABSTRACT

This application discloses a fault tolerant computation method and device for a quantum Clifford circuit with reduced resource requirement. The method includes decomposing a quantum Clifford circuit into s logic Clifford circuits and preparing auxiliary quantum states corresponding to the s logic Clifford circuits. For each logic Clifford circuit, the method further includes teleporting an input quantum state corresponding to the logic Clifford circuit to an auxiliary qubit, processing a quantum state obtained after the teleportation by the logic Clifford circuit to obtain a corresponding output quantum state; measuring a corresponding error symptom based on the input quantum state and the auxiliary quantum state; and performing error correction on the output quantum state according to the error symptom to obtain an error-corrected output quantum state.

20 Claims, 7 Drawing Sheets

(51) Int. Cl.
*G08C 25/00* (2006.01)
*H03M 13/00* (2006.01)
*H04L 1/00* (2006.01)
*G06F 11/10* (2006.01)
*G06N 10/00* (2022.01)
*G06N 10/70* (2022.01)

(56) References Cited

FOREIGN PATENT DOCUMENTS

| CN | 108713206 A | 10/2018 |
| CN | 109257166 A | 1/2019 |
| CN | 110380824 A | 10/2019 |
| WO | WO 2004/084132 A2 | 9/2004 |

OTHER PUBLICATIONS

Office Action and Search Report of Chinese Application 202010053343.X dated Dec. 31, 2021, 5 pages.
Zheng, Yi-Cong et al., "Efficient preparation of large block code ancilla states for fault-tolerant quantum computation", University of Southern California, Los Angeles, California 09989, USA, Mar. 22, 2018 arXiv:1710.00389v2 [quant-ph], 25 pages.
Chao Han, Qubit Error Correction based on 2-6 bit encoding, Ningbo University Report (Science and Engineering), Issue 01, Jan. 10, 2012, 2 pages.
International Search Report and Written Opinion dated Jan. 27, 2021 for PCT/CN2020/124258 (9 pages).

* cited by examiner

FAULT TOLERANT COMPUTATION METHOD AND APPARATUS FOR QUANTUM CLIFFORD CIRCUIT, DEVICE, AND CHIP

RELATED APPLICATION

This application is a continuation application of PCT International patent Application No. PCT/CN2020/124258 filed on Oct. 28, 2020, which claims priority to Chinese Patent Application 202010053343.X, filed on Jan. 17, 2020, both entitled "FAULT TOLERANT COMPUTATION METHOD AND APPARATUS FOR QUANTUM CLIFFORD CIRCUIT, DEVICE, AND CHIP", which are incorporated herein by reference in their entirety.

FIELD OF THE TECHNOLOGY

Embodiments of this application relate to the field of quantum technology, and in particular, to a fault tolerant computation method, device, and apparatus for a quantum Clifford circuit.

BACKGROUND OF THE APPLICATION

Since qubits are extremely susceptible decoherence induced by noise, with current technologies, it is still not practical to directly implement large-scale quantum computation (QC) by physical qubits. With the development of the quantum error correction (QEC) code technology and fault tolerant quantum computation (FTQC) technology, it becomes possible in principle to implement QC of arbitrary precisions by qubits in presence of noise.

At present, the most popular FTQC scheme involves surface codes. In addition, there are still some other FTQC schemes, for example, a scheme based on a cascade code of a single logic qubit, a scheme based on a C4/C6 code for quantum error detection and post-selection, and a scheme based on a high-code-rate large-block qubit error correction code.

High-quality physical qubits and physical quantum gates are highly expensive, and enormous engineering costs are required to implement each high-quality qubit or quantum gate in experiments. Current FTQC schemes are usually resource-intensive in that total numbers of physical qubits and physical quantum gates needed for these schemes are excessively large.

SUMMARY

Embodiments of this application provide a fault tolerant computation method, device and apparatus for a quantum Clifford circuit, so that fewer physical qubits and physical quantum gates are used while fault tolerant computation of a quantum Clifford circuit is efficiently implemented. The technical solutions are as follows:

According to an aspect, an embodiment of this application provides a fault tolerant computation method for a quantum Clifford circuit, the method including:

decomposing a quantum Clifford circuit into s logic Clifford circuits, s being a positive integer;

preparing auxiliary states that respectively correspond to the s logic Clifford circuits;

for an $i^{th}$ logic Clifford circuit in the s logic Clifford circuits, teleporting an input state corresponding to the $i^{th}$ logic Clifford circuit to an auxiliary qubit, a quantum state obtained after the teleportation being processed by the $i^{th}$ logic Clifford circuit to obtain an output state corresponding to the $i^{th}$ logic Clifford circuit, i being a positive integer less than or equal to s;

measuring an error symptom corresponding to the $i^{th}$ logic Clifford circuit based on the input state and the auxiliary state that correspond to the $i^{th}$ logic Clifford circuit during the teleportation; and performing error correction on the output state corresponding to the $i^{th}$ logic Clifford circuit according to the error symptom corresponding to the $i^{th}$ logic Clifford circuit, to obtain an output state after fault tolerant computation.

According to another aspect, an embodiment of this application provides a fault tolerant computation method for a quantum Clifford circuit, applicable to a computer device, the method including:

decomposing a quantum Clifford circuit into s logic Clifford circuits, s being a positive integer;

preparing auxiliary states that respectively correspond to the s logic Clifford circuits;

for an $i^{th}$ logic Clifford circuit in the s logic Clifford circuits, teleporting an input state corresponding to the $i^{th}$ logic Clifford circuit to an auxiliary qubit, a quantum state obtained after the teleportation being processed by the $i^{th}$ logic Clifford circuit to obtain an output state corresponding to the $i^{th}$ logic Clifford circuit, i being a positive integer less than or equal to s;

measuring an error symptom corresponding to the $i^{th}$ logic Clifford circuit based on the input state and the auxiliary state that correspond to the $i^{th}$ logic Clifford circuit during the teleportation; and performing error correction on the output state corresponding to the $i^{th}$ logic Clifford circuit according to the error symptom corresponding to the $i^{th}$ logic Clifford circuit, to obtain an output state after fault tolerant computation.

According to another aspect, an embodiment of this application provides a fault tolerant computation apparatus for a quantum Clifford circuit, the apparatus including:

a circuit decomposition module, configured to decompose a quantum Clifford circuit into s logic Clifford circuits, s being a positive integer;

an auxiliary state preparation module, configured to prepare auxiliary states that respectively correspond to the s logic Clifford circuits;

a teleportation module, configured to: for an $i^{th}$ logic Clifford circuit in the s logic Clifford circuits, teleport an input state corresponding to the $i^{th}$ logic Clifford circuit to an auxiliary qubit, a quantum state obtained after the teleportation being processed by the $i^{th}$ logic Clifford circuit to obtain an output state corresponding to the $i^{th}$ logic Clifford circuit, i being a positive integer less than or equal to s;

an error extraction module, configured to measure an error symptom corresponding to the $i^{th}$ logic Clifford circuit based on the input state and the auxiliary state that correspond to the $i^{th}$ logic Clifford circuit during the teleportation; and a fault tolerant computation module, configured to perform error correction on the output state corresponding to the $i^{th}$ logic Clifford circuit according to the error symptom corresponding to the $i^{th}$ logic Clifford circuit, to obtain an output state after fault tolerant computation.

According to still another aspect, an embodiment of this application provides a computer device, including a processor and a memory, the memory storing at least one instruction, at least one program, a code set, or an instruction set, and the at least one instruction, the at least one program, the code set or the instruction set being loaded and executed by the processor to implement the fault tolerant computation method for a quantum Clifford circuit.

According to yet another aspect, an embodiment of this application provides a computer-readable storage medium, storing at least one instruction, at least one program, a code set or an instruction set, the at least one instruction, the at least one program, the code set or the instruction set being loaded and executed by a processor to implement the fault tolerant computation method for a quantum Clifford circuit.

According to yet another aspect, an embodiment of this application provides a computer program product, when executed, the computer program product being used for performing the fault tolerant computation method for a quantum Clifford circuit.

According to yet another aspect, an embodiment of this application provides a superconducting QC chip, the superconducting QC chip being configured to implement the fault tolerant computation method for a quantum Clifford circuit, the superconducting QC chip using a three-dimensional integrated packaging physical structure, and including m layers of physical qubits of three-dimensional integrated packaging, m being an integer greater than 1;

each layer of physical qubits being used for forming a quantum state, the quantum state including any one of the input state, the auxiliary state, and the output state; and physical qubits at the same position in different layers are coupled by a data bus.

The technical solutions provided in the embodiments of this application include at least the following beneficial effects:

A quantum Clifford circuit is decomposed into a limited constant number of logic Clifford circuits. Auxiliary quantum states that respectively correspond to the logic Clifford circuits are prepared. An input quantum state is teleported and processed by a logic Clifford circuit to obtain a corresponding output quantum state. An error symptom corresponding to the logic Clifford circuit is measured based on the input quantum state and the auxiliary quantum state during the teleportation, and error correction is then performed on the output quantum state according to the error symptom to obtain an error-corrected output quantum state after fault tolerant computation. In the foregoing manner, an implementation solution of a teleportation-based logic gate is used, so that fewer physical qubits and physical quantum gates are used while fault tolerant computation of a quantum Clifford circuit is efficiently implemented.

BRIEF DESCRIPTION OF THE DRAWINGS

To describe the technical solutions in the embodiments of this application more clearly, the following briefly describes the accompanying drawings for describing the embodiments. The accompanying drawings in the following description are merely examples, and a person of ordinary skill in the art may derive other accompanying drawings according to the accompanying drawings without creative efforts.

DESCRIPTION OF EMBODIMENTS

Figure 1:
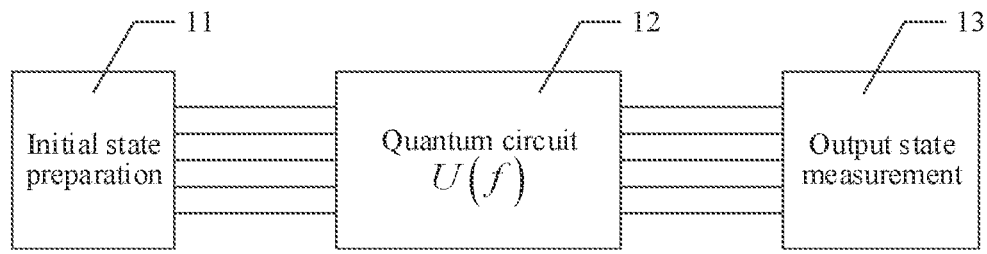
FIG. 1 is an example schematic diagram of a universal QC process according to an embodiment of this application.

To make the objectives, technical solutions, and advantages of this application clearer, the following further describes example implementations of this application in detail with reference to the accompanying drawings.

Before embodiments of this application are described, some terms involved in this application are explained first.

1. Quantum computation (QC): QC is a scheme of using quantum superposition, coherence, and entanglement properties of quantum states to rapidly complete a specific computation task.

2. Quantum teleportation: Quantum teleportation is a technology of transporting any unknown quantum state over any distance in a manner of distributing quantum entangled states and transmitting some classic information.

3. Quantum error correction (QEC): QEC is a scheme of mapping a quantum state to a subspace in the Hilbert space of a many-body quantum system for encoding the quantum state. Quantum noise may cause an encoded quantum state to be transferred to another subspace. By continuously observing a space in which a quantum state is localized (symptom extraction), quantum noise can be evaluated and corrected without interfering with the encoded quantum state, to protect the encoded quantum state against interference from the quantum noise. Specifically, for a QEC code [[n, k, d]], it represents that k logic qubits in n physical qubits are encoded, to correct any $\lfloor (d-1)/2 \rfloor$ errors that occur on any single qubit.

4. Data quantum state: A data quantum state is used for storing a quantum state of quantum information during QC.

5. Calderbank-Shor-Steane (CSS) code: A CSS code is a type of special quantum stabilizer error correction code. Stabilizer generators of the CSS code may all be direct products of Pauli-X operators or Pauli-Z operators. In addition, by performing a controlled NOT (CNOT) gate on every two paired qubits in two code blocks, a logic CNOT gate may be performed on all logic qubits.

6. Pauli-X and Pauli-Z error: A Pauli-X error and a Pauli-Z error are a Pauli-X evolution error and a Pauli-Z evolution error that are randomly generated on a quantum state of a physical qubit. According to the QEC theory, provided that an error correction code can be used to correct a Pauli-X error and a Pauli-Z error, the error correction code can be used to correct any error that occurs on a single qubit.

7. Fault tolerant quantum computation (FTQC): FTQC is QC under QEC protection. During QC, noise may be present in any physical operation, including an operation on a QEC circuit itself and qubit measurement. In addition, it is assumed that there is no noise in a classic operation. FTQC is a technical solution in which a method of properly designing a QEC scheme and performing a gate operation in a specific manner on an encoded logic quantum state is used to ensure effective control and error correction during QC using qubits with noise.

8. Physical qubit: A physical qubit is a qubit implemented by using an actual physical device.

9. Logic qubit: A logic qubit is a mathematical degree of freedom in the Hilbert subspace defined by an error correction code. The quantum state of the logic qubit is usually described by a many-body entangled state. Actual FTQC is run on a logic qubit protected by an error correction code.

10. Physical quantum gate/circuit: A physical quantum gate/circuit is a quantum gate/circuit that works on a physical qubit.

11. Logic quantum gate/circuit: A logic quantum gate/circuit is a quantum gate/circuit that works on a logic qubit.

12. Threshold theorem: In a threshold theorem, for a computation scheme that meets an FTQC requirement, when error rates of all operations are less than a threshold, a better error correction code, more qubits, and/or more quantum operations may be used to enable the accuracy of computation to arbitrarily approach 1.

13. Quantum Clifford circuit: A quantum Clifford circuit is a subset of quantum gate circuits formed by a Hadamard gate, a phase gate, and a CNOT gate.

14. Quantum state distillation: Quantum state distillation is a technology of extracting a small number of relatively pure quantum states from a large number of noise-contaminated input quantum states.

15. Uncorrelated noise: For uncorrelated noise, for an error correction code [[n, k, d]], it is set that $t=\lfloor(d-1)/2\rfloor$. It is set that noise present on the n qubits is E, and the weight (the number of working qubits) of E is defined as wt(E). If E satisfies the following relationship: when wt(E)<t, an occurrence probability of E is $O(P^s)$, where s≥wt(E), and on the contrary, when wt(E)≥t, an occurrence probability of E is $O(P^s)$, where s≥t, it is considered that E is uncorrelated. Otherwise, it is considered that E is correlated.

16. Pipeline: A pipeline in a computer is a technology of decomposing a repetitive process into a plurality of sub-processes, and each sub-process is performed in parallel with other sub-processes to implement accelerated computation.

Next, universal QC is briefly described. A general structure of universal QC is shown in FIG. 1, including: preparing an initial state 11 (which is usually a simple direct product state, for example, $|0\rangle^{\otimes k}$), performing quantum operations using a quantum circuit 12, and measuring and reading an output state 13 (alternatively referred to as output quantum state) on a standard basis, to complete an entire computation process.

The performing a quantum circuit is the core part of QC, is mathematically a unitary transformation process, and may be indicated as U(f), where f is a function of interest. In an elaborately designed quantum acceleration algorithm, important overall features (for example, the period of a periodic function, and a sum of all functional values in a domain) of the function f are extracted by using quantum interference before measurement, and it is quite difficult to compute these types of features on a classic computer.

Figure 2:
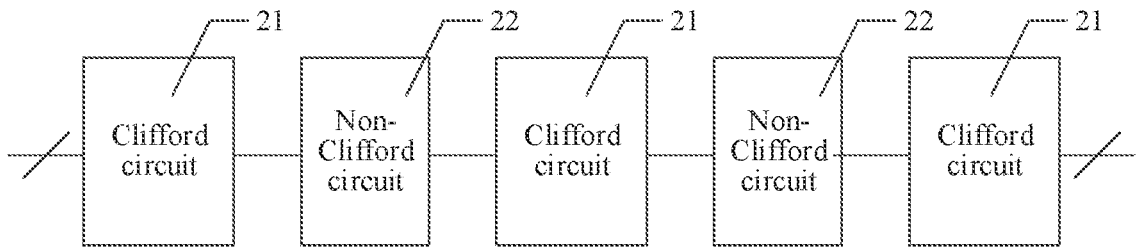
FIG. 2 is an example schematic exploded view of a Clifford circuit and a non-Clifford circuit of an overall quantum circuit according to an embodiment of this application.

Further, an arbitrary unitary transformation may be divided into a Clifford transformation (circuit) 21 and a non-Clifford transformation (circuit) 22, as shown in FIG. 2. That is, a Clifford circuit and a non-Clifford circuit form one of the basic computing set to implement universal QC.

A fault tolerant non-Clifford circuit on the logic level may be implemented through magic state distillation and quantum gate teleportation. Both magic state distillation circuit and quantum gate teleportation may be implemented by using a Clifford circuit. Therefore, a main objective of this application is to perform and optimize a logic Clifford circuit. This application provides a fault tolerant computation method for a quantum Clifford circuit, so that fewer physical qubits and physical quantum gates are used while fault tolerant computation of a quantum Clifford circuit is efficiently implemented.

Before the method embodiment of this application is described, a running environment (or referred to as an execution body or entity) of the method is described first. The fault tolerant computation method for a quantum Clifford circuit according to this embodiment of this application may be implemented by a classic computer (for example, a personal computer (PC), a server or a computing host). For example, a classic computer is used to execute a corresponding computer program to implement the method. The method may be alternatively performed by a quantum computer. The method may be alternatively performed in a hybrid device environment of a classic computer and a quantum computer. For example, a classic computer performs steps such as circuit decomposition, and a quantum computer performs steps such as auxiliary state (alternatively referred to as auxiliary quantum date) preparation, quantum teleportation, error symptom measurement, and error correction, with the reason that a corresponding computation result of performing the method is theoretically supposed to be better by directly deploying a quantum circuit on the quantum computer, instead of simulating the quantum circuit on the classic computer.

In the following method embodiment, for simplicity, the description is provided by merely using a computer device as the execution body of the steps. It is to be understood that the computer device may be a classic computer or may be a quantum computer, or may be a hybrid execution environment including a classic computer and a quantum computer. This is not limited in the embodiments of this application.

Next, the technical solution of this application is described by using several embodiments.

Figure 3:
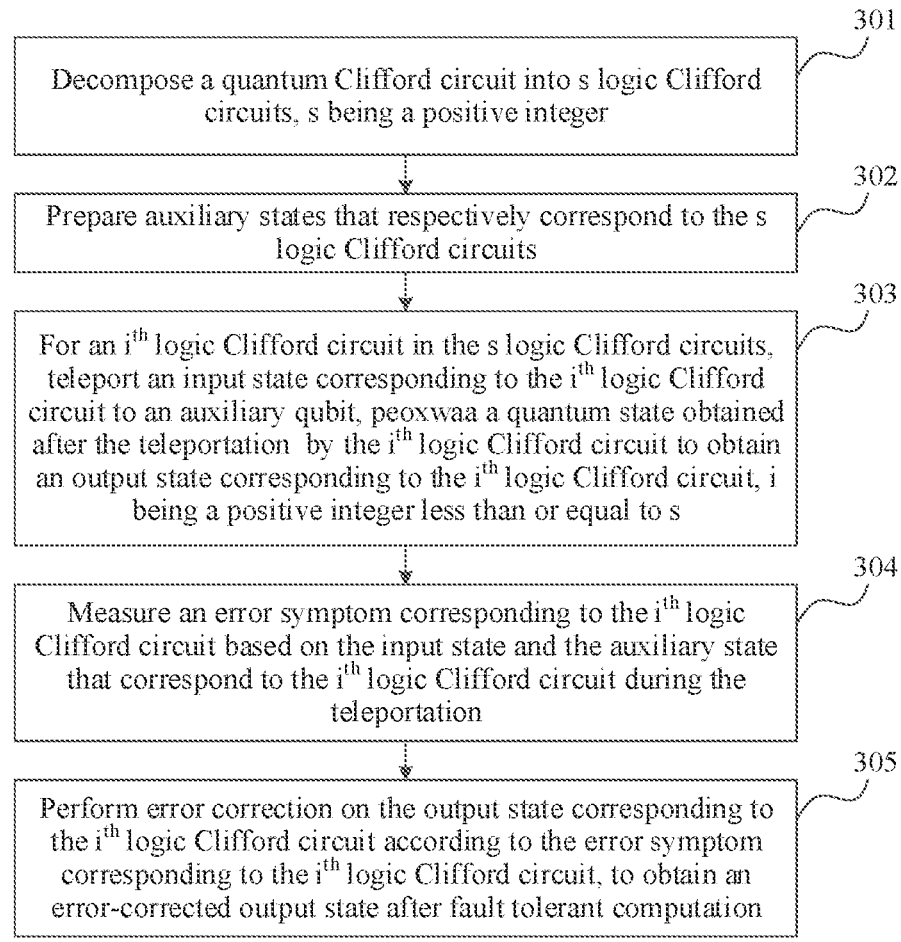
FIG. 3 is an example flowchart of a fault tolerant computation method for a quantum Clifford circuit according to an embodiment of this application.

FIG. 3 is an example flowchart of a fault tolerant computation method for a quantum Clifford circuit according to an embodiment of this application. The method may be applied to a computer device. The computer device may be any electronic device with a data processing capability and a data storage capability, for example, a classic computer device such as a PC, a server or computing host or a quantum computer device. The method may include the following steps (301 to 305):

Step 301: Decompose a quantum Clifford circuit into s logic Clifford circuits, s being a positive integer.

The computer device may acquire a circuit diagram for a quantum algorithm, extract a quantum Clifford circuit from the circuit diagram for quantum algorithm, and then decompose the quantum Clifford circuit into a limited constant number of logic Clifford circuits.

In an exemplary embodiment, the quantum Clifford circuit is transformed into a form of a symplectic matrix to obtain a symplectic matrix representation of the quantum Clifford circuit. The symplectic matrix representation of the quantum Clifford circuit is then decomposed to obtain symplectic matrix representations of the s logic Clifford circuits.

Logic Clifford circuits that are applied to any n qubits may be represented as a 2n×2n binary symplectic matrix. Clifford circuits on all n qubits form a symplectic group on $F_2$. $F_2$ represents a number field formed by 0s and 1s. It may be proven that a symplectic matrix on any $F_2$ may be divided as follows:

Based on Bruhat decomposition, any 2n×2n binary symplectic group may be decomposed into the following form:

$$M = M_C^{(1)} M_P^{(1)} M_C^{(2)} M_P^{(2)} M_H^{(1)} M_P^{(3)} (\pi M_C^{(3)} \pi^{-1}) M_P^{(4)} (\pi M_C^{(4)} \pi^{-1}),$$

where $M_C^{(j)}$ is a symplectic matrix of a phase—C—, a circuit represented by the symplectic matrix is a type of a CNOT gate including C (q,r) (a qubit q is used as a control, and qubit r is a controlled target, and q<r), $M_P^{(j)}$ and $M_H^{(j)}$ represent symplectic matrices of a phase—P—and a phase—H—, respectively, and $\pi$ is a permutation matrix, representing the permutation of a qubit.

That is, any quantum Clifford circuit may be divided into a limited number of (nine in the foregoing formula) logic Clifford circuits, and the logic Clifford circuits each includes a single type gate. The single type gate includes any one of a CNOT gate, a Hadamard gate, and a phase gate. Such division is referred to as regular representation.

In an exemplary embodiment, s is less than or equal to 9. That is, a quantum Clifford circuit is decomposed into less than nine logic Clifford circuits, so that the number of steps of real-time computation of the quantum Clifford circuit is reduced to a limited constant, the depth of real-time computation is reduced, and the time required for real-time computation is reduced.

302: Prepare auxiliary states that respectively correspond to the s logic Clifford circuits.

After the decomposition to obtain the s logic Clifford circuits, an auxiliary state for each logic Clifford circuit may be determined, and auxiliary states that respectively correspond to the logic Clifford circuits are then prepared.

The logic Clifford circuits obtained from the decomposition each includes a single-type gate. Therefore, it is only necessary to prepare the following three types of auxiliary states: an auxiliary state $|\Psi_L^{U_C}\rangle$ corresponding to a CNOT gate, an auxiliary state $|\Psi_L^{U_H}\rangle$ corresponding to a Hadamard gate, and an auxiliary state $|\Psi_L^{U_P}\rangle$ corresponding to a phase gate. The three types of auxiliary states may be represented by using the following formulas:

$$|\Psi_L^{U_C}\rangle = I \otimes U_C (|0_L\rangle \otimes |0_L\rangle + |1_L\rangle \otimes |1_L\rangle)^{\otimes k};$$

$$|\Psi_L^{U_H}\rangle = I \otimes U_H (|0_L\rangle \otimes |0_L\rangle + |1_L\rangle \otimes |1_L\rangle)^{\otimes k}; \text{ and}$$

$$|\Psi_L^{U_P}\rangle = I \otimes U_P (|0_L\rangle \otimes |0_L\rangle + |1_L\rangle \otimes |1_L\rangle)^{\otimes k};$$

where $U_C$, $U_H$, and $U_P$ respectively represent the CNOT gate, the Hadamard gate, and the phase gate, I represents an identity, indicating that there is no effective operation, and $|0_L\rangle$ and $|1_L\rangle$ represent a 0 state and a 1 state on the logic level, respectively.

In addition, symplectic matrices corresponding to $U_C$, $U_H$, and $U_P$ are respectively represented as follows:

$$M_C = \begin{pmatrix} U & 0_n \\ \hline 0_n & (U^t)^{-1} \end{pmatrix},$$

$$M_H = \begin{pmatrix} I_n + \Lambda_n^m & \Lambda_n^m \\ \Lambda_n^m & I_n + \Lambda_n^m \end{pmatrix}, \text{ and}$$

$$M_P = \begin{pmatrix} I_n & \Lambda_n^m \\ \hline 0_n & I_n \end{pmatrix},$$

where $I_n$ is an identity matrix, $\Lambda_n^m$ is a diagonal matrix that contains m 1s and remaining 0s, and U is an upper triangular non-singular matrix. If a binary stabilizer expression is used, corresponding binary representations of the three types of auxiliary states are as follows:

$$\Psi_L^{U_C} = \begin{pmatrix} I_k & U & 0 & 0 \\ 0 & 0 & I_k & (U^t)^{-1} \end{pmatrix},$$

$$\Psi_L^{U_H} = \begin{pmatrix} I_k & I_k + \Lambda_k^m & 0 & \Lambda_k^m \\ 0 & \Lambda_k^m & I_k & I_k + \Lambda_k^m \end{pmatrix}, \text{ and}$$

$$\Psi_L^{U_P} = \begin{pmatrix} I_k & I_k & 0 & \Lambda_k^m \\ 0 & 0 & I_k & I_k \end{pmatrix}.$$

Step 303: For an $i^{th}$ logic Clifford circuit in the s logic Clifford circuits, teleport an input state (alternatively referred to as an input quantum state) corresponding to the $i^{th}$ logic Clifford circuit to an auxiliary qubit, and process a quantum state obtained after the teleportation by the $i^{th}$ logic Clifford circuit to obtain an output state corresponding to the $i^{th}$ logic Clifford circuit, i being a positive integer less than or equal to s.

In this embodiment of this application, the auxiliary qubit is generated, and the input state corresponding to the logic Clifford circuit is teleported to the auxiliary qubit, so that the input state is processed by the logic Clifford circuit, to obtain the corresponding output state.

Figure 4:
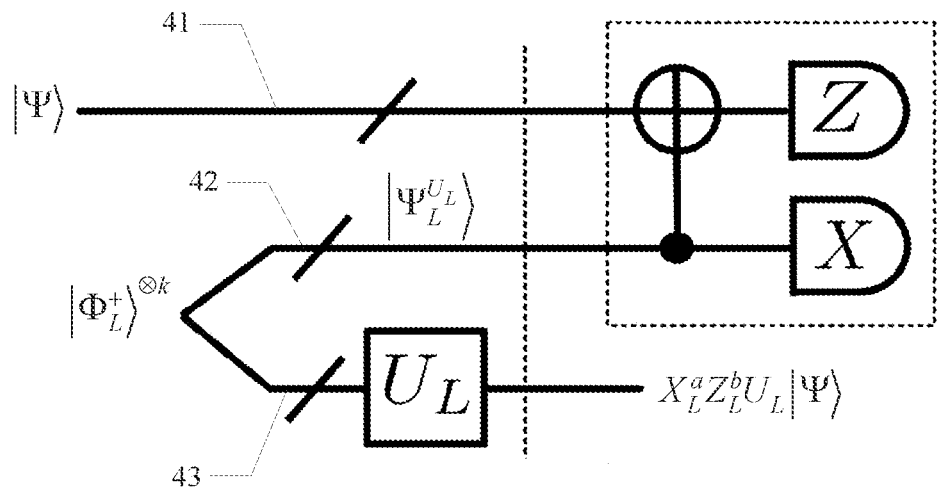
FIG. 4 is an example schematic diagram of the error symptom extraction-circuit teleportation scheme in the embodiment in FIG. 3.

For example, the circuit may be shown in FIG. 4. There are three straight lines with oblique lines, namely, a straight line 41, a straight line 42, and a straight line 43 in FIG. 4. Each straight line with an oblique line corresponds to a qubit block, representing that a group of n physical qubits are encoded in a QEC code [[n, k, d]]. That is, each straight line with an oblique line includes n physical qubits and k logic qubits. The n physical qubits corresponding to the straight line 41 are used as the input state $|\Psi\rangle$, the n physical qubits corresponding to the straight line 42 are used as the auxiliary state, and the n physical qubits corresponding to the straight line 43 are used as the quantum state obtained after the input state $|\Psi\rangle$ is teleported.

Assuming that there is no noise and $U_L = I$ (where $U_L$ represents a logic circuit that needs to be implemented, I represents an identity, indicating that there is no effective operation), the circuit in FIG. 4 may teleport the input state $|\Psi\rangle$ to the n auxiliary qubits corresponding to the straight line 41. When in which there is noise and $U_L$ is a logic Clifford circuit, a quantum state obtained after the input state $|\Psi\rangle$ is teleported is processed by the logic Clifford circuit $U_L$, to obtain a corresponding output state $X_L^a Z_L^b U_L |\Psi\rangle$.

In FIG. 4, it may be considered that the 2n physical qubits represented by the straight line 42 and the straight line 43 are in a joint entangled state, and a specific form is a direct product of k logic Bell states, that is:

$$|\Phi_L^+\rangle^{\otimes k} = \frac{1}{\sqrt{2}}(|0_L\rangle \otimes |0_L\rangle + |1_L\rangle \otimes |1_L\rangle)^{\otimes k}.$$

Step 304: Measure an error symptom corresponding to the $i^{th}$ logic Clifford circuit based on the input state and the auxiliary state that correspond to the $i^{th}$ logic Clifford circuit during the teleportation.

The purpose for QEC and FTQC is to measure an error symptom to evaluate a most probably occurred error and perform correction. However, a quantum circuit for extracting an error symptom may be instead more likely to introduce more errors into quantum states (that is, "an output quantum state", which is also referred to as "output state") of encoded computation information. Therefore, without careful design, QEC may be instead more likely to cause logic errors in data quantum states.

When $U_L$ is a logic Clifford circuit, that is, an auxiliary state $|\Psi_L^{U_L}\rangle$ is prepared on the left side of the dotted line in FIG. 4:

$$|\Psi_L^{U_L}\rangle = (I \otimes U_L)|\Phi_L^+\rangle^{\otimes k}.$$

As can be learned from FIG. 4, a CNOT gate is performed on every two of the n physical qubits corresponding to the input state $|\Psi\rangle$ and the n physical qubits corresponding to the prepared auxiliary state $|\Psi_L^{U_L}\rangle$, each physical qubit in the n physical qubits corresponding to the input state $|\Psi\rangle$ is then measured in a Pauli-Z direction, and each physical qubit in the n physical qubits corresponding to the auxiliary state $|\Psi_L^{U_L}\rangle$ is measured in a Pauli-X direction, to obtain a measurement result. The error symptom corresponding to the logic Clifford circuit may be determined based on the measurement result. In some embodiments, a Knill error symptom extraction circuit may be used to extract an error symptom.

Step 305: Perform error correction on the output state corresponding to the $i^{th}$ logic Clifford circuit according to the error symptom corresponding to the $i^{th}$ logic Clifford circuit, to obtain an output state after fault tolerant computation.

After the error symptom corresponding to the logic Clifford circuit is determined, error correction may be performed on the output state of the logic Clifford circuit to obtain an output state after fault tolerant computation.

In some embodiments, based on the measurement result, in one aspect, the error symptom may need to be determined, and in another aspect, the logic Pauli-X operator and the logic Pauli-Z operator that need to be corrected further need to be determined. An occurrence position and a type of an error are determined based on the error symptom corresponding to the logic Clifford circuit and by using a decoding algorithm corresponding to a QEC code. The error correction is performed on the output state corresponding to the logic Clifford circuit, and the output state after the fault tolerant computation is obtained after the logic Pauli-X operator and the logic Pauli-Z operator that need to be corrected are corrected. That is, the error correction is performed on the output state $X_L^a Z_L^b U_L^k |\Psi\rangle$ by using the logic Pauli-X operator and the logic Pauli-Z operator, and after the logic Pauli-X and the logic Pauli-Z operator are corrected, the output state $U_L|\Psi\rangle$ after the fault tolerant computation may be obtained. The output state $U_L|\Psi\rangle$ after the fault tolerant computation includes an output state obtained after the input state $|\Psi\rangle$ is processed by the fault tolerant Clifford circuit. In the foregoing manner, the quantum state error correction and the fault tolerant Clifford circuit operation can be simultaneously completed.

Assuming that the auxiliary state is not contaminated with noise, the extraction of the error symptom includes the extraction of a noise symptom of the contaminated input state $|\Psi\rangle$. Subsequently, the error symptom is obtained through measurement, and decoding is performed, so that it may be estimated which errors have occurred before the teleportation, and the logic Pauli-X operator and the logic Pauli-Z operator that need to be corrected are computed. Finally, error correction is performed in the third outputted group of physical qubits (that is, the n physical qubits corresponding to the straight line 43 in FIG. 4) in transmission, to obtain the output state after fault tolerant computation.

However, generally, the auxiliary state has been contaminated by noise during the preparation, and the noise has two types of undesired impact: 1. An error is transferred to a data qubit by using a CNOT gate between an auxiliary qubit and the data qubit. If there is a high occurrence probability for such a case, an uncorrectable error may be introduced to cause the overall computation to fail. 2. Incorrect decoding may be caused by an inaccurate measurement result. When it can be ensured that correlated noise is prevented from being transferred back to a data qubit from an auxiliary qubit, due to the second factor, it is still necessary to repeatedly extract and measure error symptoms and determine reliable eigenvalues of error symptoms and logic Pauli-X and Z direct product operators through majority voting (on the measurement results). Apart from that, this process consumes a large number of valuable auxiliary states, and such repeated measurements are only acceptable for the implementation of QEC, but are not acceptable for the implementation of quantum circuit teleportation with the reason that the logic Pauli-operators need to be corrected right away after the teleportation and based on a measurement and error correction result, which however cannot be obtained through majority voting on the results of the repeated measurements.

Figure 5:
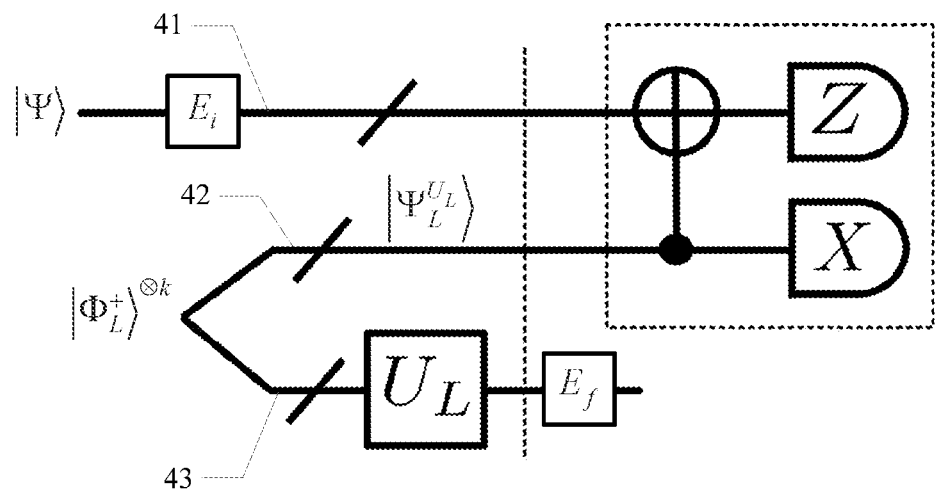
FIG. 5 is an example equivalent schematic diagram of the error symptom extraction-circuit teleportation scheme when any error occurs in the embodiment in FIG. 3.

However, for the structure of the Knill error symptom extraction circuit, there is the following theorem: If the prepared auxiliary state $|\Psi_L^{U_L}\rangle = (I \otimes U_L)|\Phi_L^+\rangle^{\otimes k}$ does not include correlated noise, any error that occurs in the circuit may be equivalent to an uncorrelated error $E_i$ that occurs in a data qubit block before error symptom extraction and an uncorrelated error $E_f$ that occurs in a second qubit block after the teleportation, as shown in FIG. 5. Therefore, for the Knill error symptom extraction circuit, the teleportation and QEC may be completed after the circuit is used once. With the guarantee of this theorem, the circuit shown in FIG. 4 may be directly used to perform the logic Clifford circuit and at the same time perform error correction.

That is, if the three types of auxiliary states contain no correlated noise, a limited constant number of error symptom extractions may be used to complete any logic Clifford circuit with error tolerance, and effective error correction can be kept while the logic Clifford circuit is completed. Examples of preparation of the three types of auxiliary states are further described in the following embodiments.

In the foregoing embodiments, the $i^{th}$ logic Clifford circuit obtained after decomposition is used as an example to describe the FTQC of the $i^{th}$ logic Clifford circuit. The $i^{th}$ logic Clifford circuit may be any logic Clifford circuit obtained by decomposing a quantum Clifford circuit. Therefore, for each logic Clifford circuit in the s logic Clifford circuits, the manner described above may be used to implement FTQC. In addition, the output state after the fault tolerant computation for the $i^{th}$ logic Clifford circuit may be used as an input state of an $(i+1)^{th}$ logic Clifford circuit. Such a process is repeated until an output state after fault tolerant computation for an $s^{th}$ logic Clifford circuits is obtained, and an output state after fault tolerant computation for the entire quantum Clifford circuit is obtained.

To summarize, in the technical solution provided in this application, a quantum Clifford circuit is decomposed into a limited constant number of logic Clifford circuits, auxiliary states that respectively correspond to the logic Clifford circuits are prepared, an input state is teleported and processed by a logic Clifford circuit to obtain a corresponding output state, an error symptom corresponding to the logic Clifford circuit is obtained through measurement based on the input state and the auxiliary state during the teleportation, and error correction is then performed on the output state according to the error symptom to obtain an output state after fault tolerant computation. In the foregoing manner, an implementation solution of a teleportation-based logic gate is used, so that fewer physical qubits and physical quantum gates are used while fault tolerant computation of a quantum Clifford circuit is efficiently implemented.

In an exemplary embodiment, the preparation of auxiliary states that respectively correspond to the s logic Clifford circuits may include the following substeps:

1. determining the auxiliary states that respectively correspond to the s logic Clifford circuits;
2. building fault tolerant preparation circuits that respectively correspond to the auxiliary states; and
3. preparing the auxiliary states by using the fault tolerant preparation circuits in parallel in a pipelined manner.

Because a period of time is needed to prepare an auxiliary state, if the preparation of the auxiliary state is excessively slow, the preparation of the auxiliary state may need to be completed first even if the fault tolerant computation for the logic Clifford circuit can be performed very fast. To fully utilize the benefits of the fault tolerant computation for the logic Clifford circuit and to further reduce the period of time of real-time computation to a value of a limited constant, it may be necessary to properly set an auxiliary state preparation circuit and the time to start to prepare an auxiliary state. For different auxiliary states, different auxiliary state preparation circuits (that is, the foregoing fault tolerant preparation circuits) need to be built for preparation.

Figure 6:
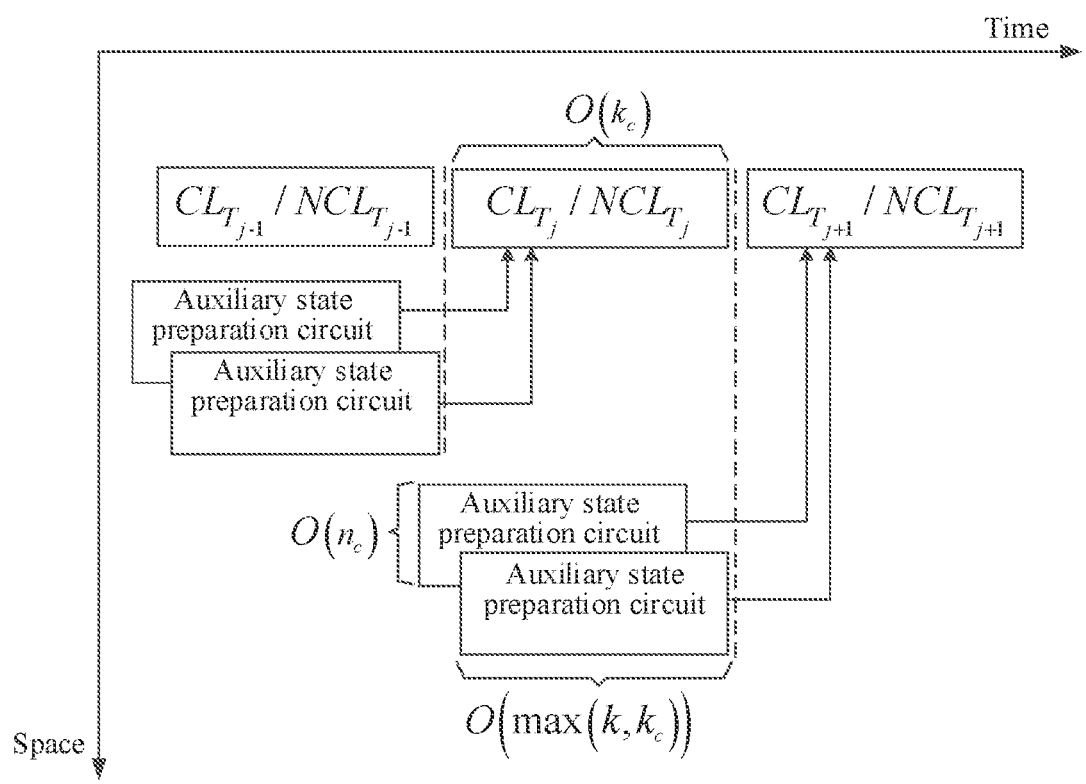
FIG. 6 is an example schematic space-time diagram of a pipeline for continuously performing a logic Clifford circuit and a non-logic Clifford circuit according to an embodiment of this application.

In this example embodiment of this application, it is proposed to use fault tolerant preparation circuits in parallel in a pipelined manner to prepare auxiliary states, to improve the efficiency of preparing the auxiliary states and ensure the fast implementation of the fault tolerant computation for the logic Clifford circuit. Specifically, a specific pipeline structure may be designed according to a specific algorithm. For example, the algorithm may be based on the following structure:

$$\ldots, CL_{T_{j-1}}, NCL_{T_{j-1}}, CL_{T_{j-1}}, \ldots, CL_{T_{j-1}}, NCL_{T_j}, CL_{T_j}, \ldots$$

where $CL_{T_j}/NCL_{T_j}$ represents that within a specific period of time $T_j$, the circuit only contains a fixed group of Clifford circuits and non-Clifford circuits (a non-Clifford circuit is generated by performing magic state distillation on a Clifford circuit). To simplify description, it is assumed that the total number (including magic state distillation) of repetitive Clifford circuits that need to be used in each period of time is $O(k_c)$. A classic error correction code selected for distillation is adjusted according to the actual number of circuits, and $k_c$ is determined by the number of repetitive Clifford circuits that need to be performed subsequently. $O(n_c)$ blocks need to be inputted within each period of time for state preparation. To keep the continuous running of the pipeline and referring to FIG. 6, a required depth (that is, the number of auxiliary blocks) for the pipeline is $O(n_c \max(k_c, k)/k_c)$. In this way, it can be ensured that auxiliary states are continuously supplied to reduce an execution time. If there is a lower requirement for an actual execution time, the number of auxiliary states may be reduced or a distillation circuit with relatively low efficiency may be used. The selection herein is relatively flexible, and choices may be made according to an actual requirement.

Figure 7:
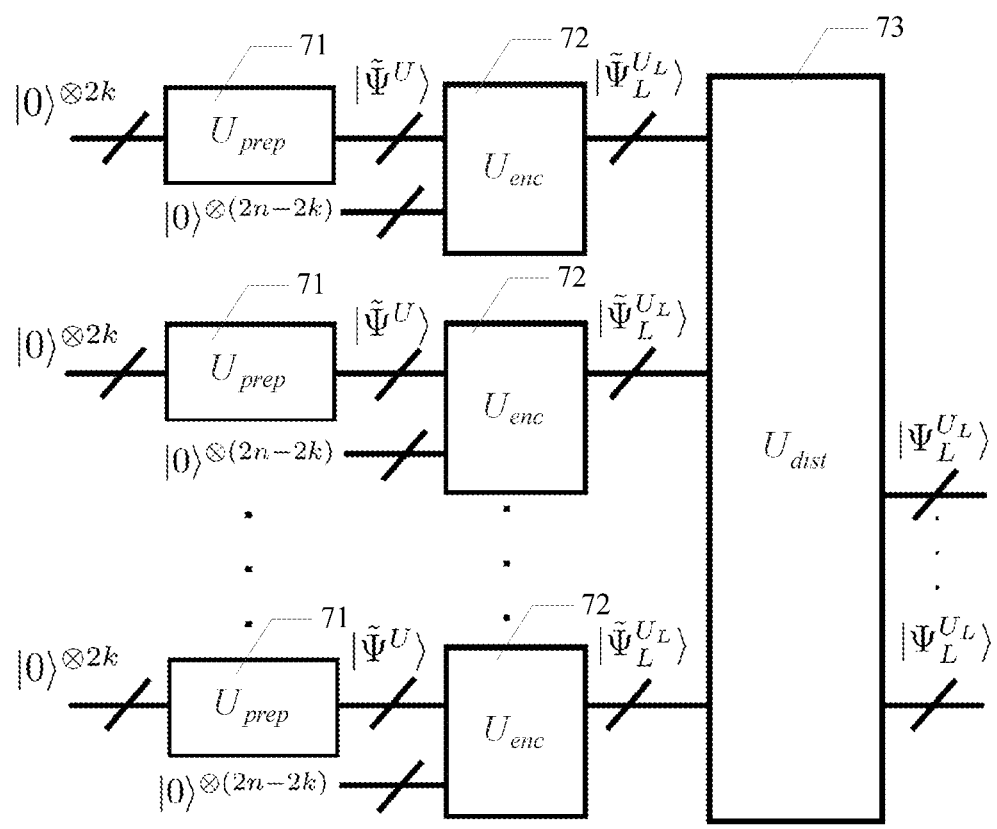
FIG. 7 is an example schematic diagram of a procedure for preparing an auxiliary state according to an embodiment of this application.

In addition, an example basic procedure of preparing an auxiliary state is shown in FIG. 7, First, a large number of identical auxiliary states are prepared on a physical level by using $U_{prep}$ 71 (which is a Clifford circuit), and the auxiliary states are then encoded into a QEC code [[n, k, d]] by using an encoding circuit $U_{enc}$ 72 (which, for example, is also a Clifford circuit) on a qubit block. $U_{prep}$ 71 and $U_{enc}$ 72 contain noise in practice (quantum noise is omnipresent with current human engineering technology). These encoded auxiliary states are delivered to a distillation circuit $U_{dist}$ 73 (which also contains noise), and all qubits in some blocks are then measured. Eigenvalues of all elements (which are all direct products of Pauli-operators) in a stabilizer group of corresponding error correction codes in outputted qubit blocks may be evaluated by using these measurement results, and the same method may also be used to estimate an eigenvalue of a logic Pauli-operator of an outputted block. The distillation circuits may be built or selected according to parity check matrices of some classic error correction codes. An estimated eigenvalue (error symptom) of each outputted qubit block further requires compatibility check and post-selection (incompatible bit blocks are removed). In this case, quantum error correction may be performed on auxiliary states in those outputted code blocks according to these error symptoms and eigenvalues of logic Pauli-operators.

The distillation circuit $U_{dist}$ may be built according to a parity check matrix of a classic error correction code $[n_c, k_c, d_c]$, and has a form of $H=(I_{n_c-k_c}|A_c)$. Specific operations are as follows: For a group of $n_c$ auxiliary state blocks, the first $r_c=n_c-k_c$ auxiliary state blocks are selected to keep a classic parity check result, and a CNOT gate may then be placed according to the position of 1 in a row $A_c$. Specific operations are as follows:

If $[A_c]_{i,j}=1$, a CNOT gate is performed on every two qubits of an $(r_c+j)^{th}$ block and an $i^{th}$ block, and qubits of the first $r_c$ blocks (including all parity check information) are then measured. Error symptoms of $k_c$ outputted blocks and eigenvalues of logic Pauli-operators may be evaluated by using the information. If results of evaluation on a single block are compatible with each other, an output quantum state is accepted. Otherwise, qubits of this block are discarded.

During the use of the distillation circuit $U_{dist}$ described above, when an error rate of a quantum gate or measurement is relatively low, if $d_c$ is greater than a distance d of an underlying CSS quantum code, an outputted block does not include a correlated Pauli-X error after those qubit blocks with incompatible stabilizer (syndrome) eigenvalues are filtered out. A similar method may be used to remove a correlated Pauli-Z error.

According to the QEC theory, each qubit block with noise may be considered as being separately contaminated by a Pauli-X type error and a Pauli-Z type error. Therefore, the purpose of distillation is to separately remove the X type correlated error and the Z type correlated error. The correlation of one type of noise may be effectively removed after each time of distillation. Therefore, two times of distillation are required to remove the two types of correlation. During the removal of the second type of correlated noise, the correlation of the first type of noise is not allowed to be again introduced to the output state in the circuit.

Figure 8:
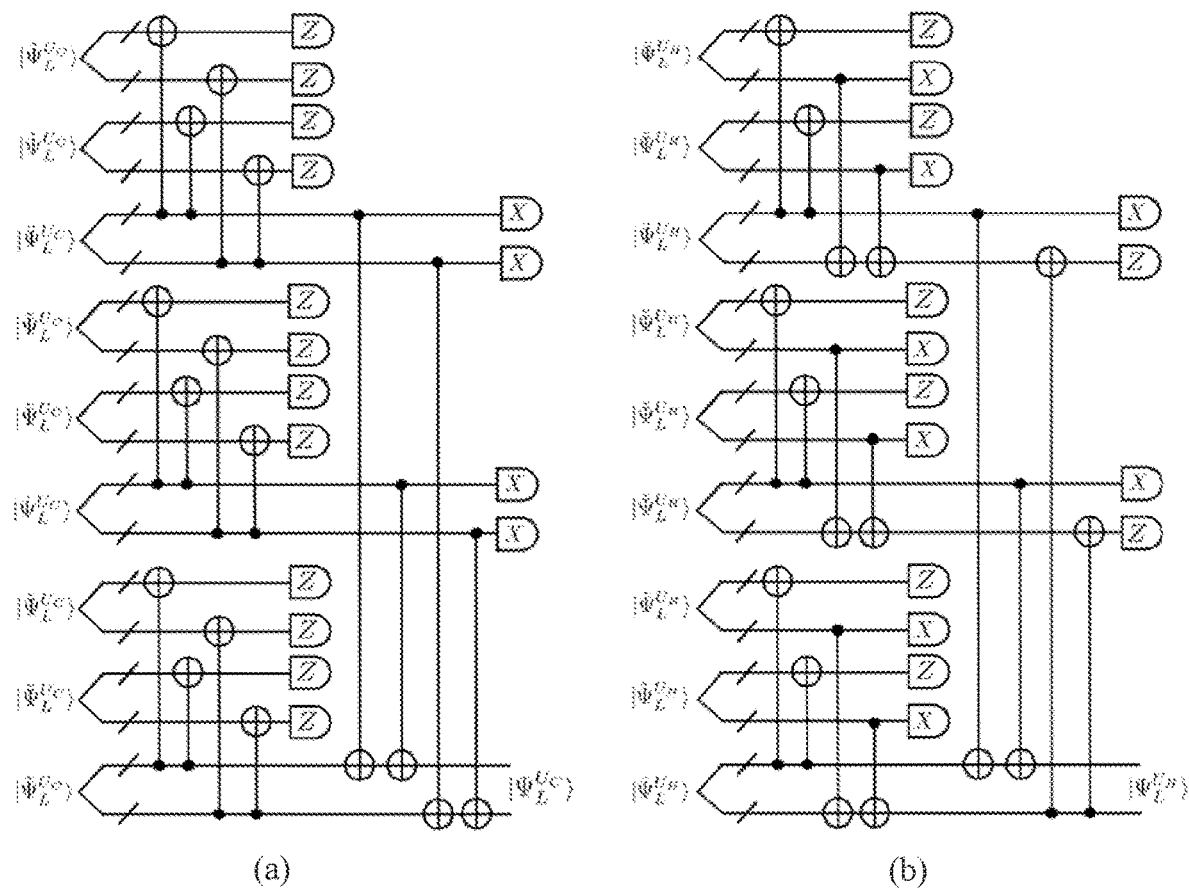
FIG. 8 is an example schematic diagram of two distillation circuits according to an embodiment of this application.

A feasible manner is to cascade two distillation circuits (a plurality of outputted blocks in the first phase need to be randomly scrambled before being inputted into the second-stage distillation circuit) to remove the correlated X-type error and the correlated Z-type error simultaneously. Part (a) in FIG. 8 shows a distillation circuit corresponding to $|\Psi_L^{U_C}\rangle$, and Part (b) shows a distillation circuit corresponding to $|\Psi_L^{U_H}\rangle$. As shown by Part (a) in FIG. 8, the distillation circuit include a two-stage distillation circuit that uses a classic code [3, 1, 3] for distillation. For input and output auxiliary states based on two classic error correction codes $[n_{c_1},k_{c_1},d_{c_1}]$ and $[[n_{c_2},k_{c_2},d_{c_2}]]$, the numbers of qubit blocks are respectively $n_{c_1}n_{c_2}$ and $Y(p)k_{c_1}k_{c_2}$. Y (p) herein is a net output rate of distillation, and is defined as:

$$Y(p) = \frac{k_{c_1}k_{c_2}(1-R_1(p))(1-R_2(p))}{n_{c_1}n_{c_2}};$$

$R_i(p)$ herein is a rejection probability of a block in post-selection during an $i^{th}$-stage distillation, and usually depends on an error rate p of a physical quantum gate or measurement. Asymptotically, when p is relatively small, the reject probability tends to $O(p^2)$, because an error of a quantum gate or measurement needs to occur at least twice before one reject block can be outputted. Numerical simulation shows that when an error rate is small enough, $R_1(p)$ and $R_2(p)$ may be small enough to be ignored. In addition, there is already a classic error correction code that is adequate to reach a channel capacity, so that a theoretically allowable maximum value of Y (p) is kept when $n_{c_1}, n_{c_2}, d_{c_1}, d_{c_2}$ are relatively large, that is, $Y(p)-O(1)$. In this way, a required auxiliary quantum state may be prepared at a very low asymptotic redundancy rate.

It is already described above that the distillation circuit shown in Part (a) in FIG. 8 may be used for distilling an adequate (without correlated noise) auxiliary state $|\Psi_L^{U_C}\rangle$. Similarly, the distillation circuit Part (b) in FIG. 8 may be used for distilling an adequate auxiliary state $|\Psi_L^{U_H}\rangle$. It is still necessary to prepare an adequate auxiliary state $|\Psi_L^{U_P}\rangle$ to implement the preparation of all three auxiliary states. It is noted that the binary representation of $|\Psi_L^{U_P}\rangle$ is:

$$\Psi_L^{U_P} = \begin{pmatrix} I_k & I_k & 0 & \Lambda_k^m \\ 0 & 0 & I_k & I_k \end{pmatrix}.$$

The QEC code to be used is further restricted herein. A type of self-dual CSS code is considered. The weight of a stabilizer generator of the CSS code is doubly-even (a multiple of 4), and at the same time it is stipulated that all logic Pauli-X operators have odd weights (This always applies for a cyclic code with an odd distance d). In this case, an adequate CSS state may be prepared first, and a binary representation of the CSS state is:

$$\Psi_L^{U'_P} = \begin{pmatrix} I_k & \Lambda_k^m & 0 & 0 \\ 0 & 0 & \Lambda_k^m & I_k \end{pmatrix}.$$

It is further noted that $|\Psi_L^{U_P}\rangle$ may be effectively prepared by using the distillation circuit shown in Part (a) in FIG. 8. Next, one phase gate is applied to each qubit in the second qubit block in the auxiliary state. For a required special CSS code, this operation is equivalent to applying one logic phase gate to each logic qubit in the second qubit block, and the effect of the operation is to transform the quantum state into:

$$\Psi_L^{U''_P} = \begin{pmatrix} I_k & \Lambda_k^m & 0 & \Lambda_k^m \\ 0 & 0 & \Lambda_k^m & I_k \end{pmatrix}.$$

Finally, a logic CNOT gate may be implemented between the first block and the second block of the auxiliary state to obtain $|\Psi_L^{U_P}\rangle$. It is noted that such a CNOT gate circuit may be obtained by using an adequate CSS state. That is, the distillation circuit shown in Part (a) in FIG. 8 needs to be used again.

Two-stage state distillation is an auxiliary state preparation scheme that is more comprehensible in concept. Although the scheme is already an asymptotically optimal scheme, in practice, $n_{c_1} n_{c_2}$ qubit blocks need to be inputted at once. This number is usually enormous. Not only the total number of required qubits is enormous, but also the overall process of distillation is excessively complex, and as a result a relatively low threshold of the distillation circuit is caused. In addition, it is also very inconvenient and inflexible to operate so many qubit blocks.

Therefore, this application further provides a more effective auxiliary state preparation scheme. In brief, a Steane scheme may be used to compress resources and rapidly complete preparation (a circuit depth of approximately O(k) is required and is asymptotically the same as the depth of the distillation circuit). The rapid screening scheme Steane can be used for only the first round of removal of correlated noise, but cannot be used for the second round because the circuit in the scheme introduces correlated noise. Therefore, it is proposed in this application to use the scheme Steane for the first layer and then apply the distillation scheme to the second layer. In this way, the number of inputted blocks is $n_c$, and the number of outputted blocks is $k_c$. The scheme reduces circuit complexity (and at the same time increases the threshold of the distillation circuit) and also makes the entire scheme more flexible (the number of qubit blocks to be inputted at once is reduced).

For the technical solution provided in the embodiments of this application, asymptotic analysis is used to estimate an average resource overhead (a resource overhead required for each logic Clifford circuit), and comparison is made with other related schemes. For comparison results, reference may be made to Table 1 below:

TABLE 1

| Scheme/Average resource overhead | Number of bits | Number of physical gates | Number of auxiliary states | Real-time circuit depth | Offline circuit depth |
|---|---|---|---|---|---|
| 1. Standard circuit model | $O(k)$ | $O(k^2/\log k)$ | N/A | $O(k)$ | N/A |
| 2. Technical solutions of this application | $O(k)$ | $O(k^2/\log k)$ | $O(1)$ | $O(1)$ | $O(\max(k, k_{c_1}))$ |
| 3. Conventional [[n, k, d]]-based circuit teleportation fault tolerant scheme | $O(k)$ | $O(k^2 d)$ | $O(kd)$ | $O(kd)$ | $O(kd)$ |
| 4. Conventional [[n, k, d]]-based Pauli-measurement scheme | $O(k)$ | $O(k^4/(\log k)^2)$ | N/A | $O(k^2/\log k)$ | $O(\max(k, k_{c_1}))$ |
| 5. [[$kd^2$, k, d]]-based surface code | $O(kd^2)$ | $O(k^3 d^2/\log k)$ | N/A | $O(k^2 d/\log k)$ | N/A |

As can be learned from Table 1, when k is relatively large (an asymptotic trend), the technical solution of this application, such as performing a Clifford circuit on the physical level, achieves substantial reductions in computing resources as compared with other schemes, and is optimal in terms of the real-time circuit depth. In addition, by using the pipelined structure, the total number of qubits needing to be consumed in the technical solution of this application is $O(n_c k \max(k_c, k)/k_c)$, and the technical solution is better than all the schemes except Scheme 3. Scheme 3 has a much higher time overhead than the technical solution of this application. That is, comprehensively, the technical solution of this application has made noticeable improvements in the total number of required physical qubits, the total number of quantum gates, and real-time computation duration as compared with related schemes with asymptotic approximation.

The technical solution of this application will be beneficial after quantum computers enter practical use and will generate significant value in quantum cloud computing platforms and QC services that will become available in the future. Especially, in the case of an enormous number of logic qubits (for example, the simulation and computation for the quantum field theory require millions of logic qubits), a series of algorithms including quantum many-body simulation (quantum many-body simulation may be the most important application of QC, and in this specific case, the speed may be potentially increased by hundreds to thousands of times) can be significantly accelerated, and the number of required physical qubits and the number of required physical quantum gate can be significantly reduced.

Figure 9:
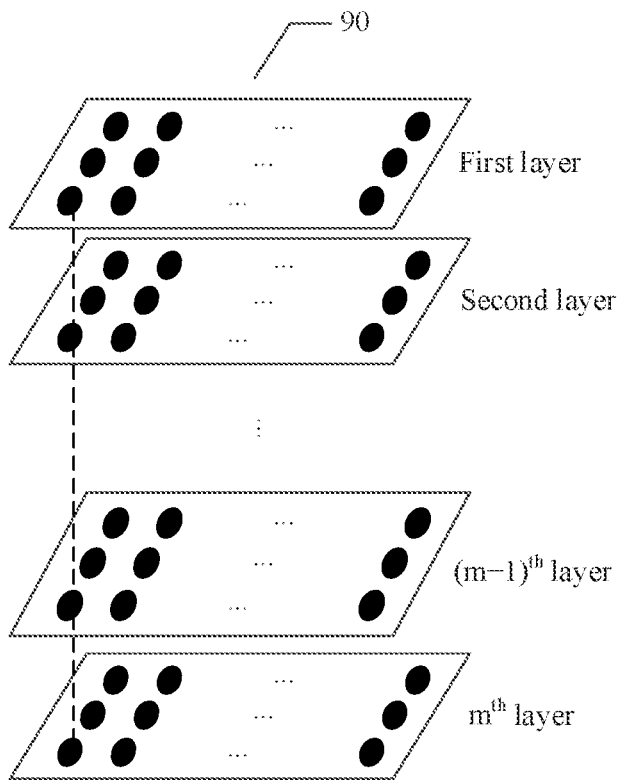
FIG. 9 is an example schematic diagram of three-dimensional packaging of a superconducting QC chip according to an embodiment of this application.

An exemplary embodiment of this application further provides a superconducting QC chip. The superconducting QC chip is configured to implement the foregoing fault tolerant computation method for a quantum Clifford circuit. As shown in FIG. 9, a superconducting QC chip 90 uses a three-dimensional integrated packaging physical structure, including m layers of physical qubits of the three-dimensional integrated packaging, where m is an integer greater than 1.

In FIG. 9, a black dot in each layer represents a physical qubit, and physical qubits in each layer are located in the same code block. Each layer of physical qubits are used for forming a quantum state. The quantum state may include any one of the input state, the auxiliary state, and the output state mentioned above.

For physical qubit in the same layer, a universal quantum resonant cavity may be used for achieve qubit-qubit coupling need to implement remote coupling. For physical qubits at the same position in different layers, every two qubits may be coupled by a data bus. In some embodiments, for the physical qubits at the same position in different layers, the data bus is formed by using a deep through-silicon via technology to couple the physical qubits.

With the foregoing solution, a three-dimensional integrated packaging physical structure is used to implement a superconducting QC chip, and to implement a remote CNOT gate, thereby providing full hardware support for implementing the foregoing fault tolerant computation method for a quantum Clifford circuit.

The following further describes apparatus embodiments of this application, which can be used to execute the method embodiments of this application. For details not disclosed in the apparatus embodiments of this application, refer to the method embodiments of this application.

Figure 10:
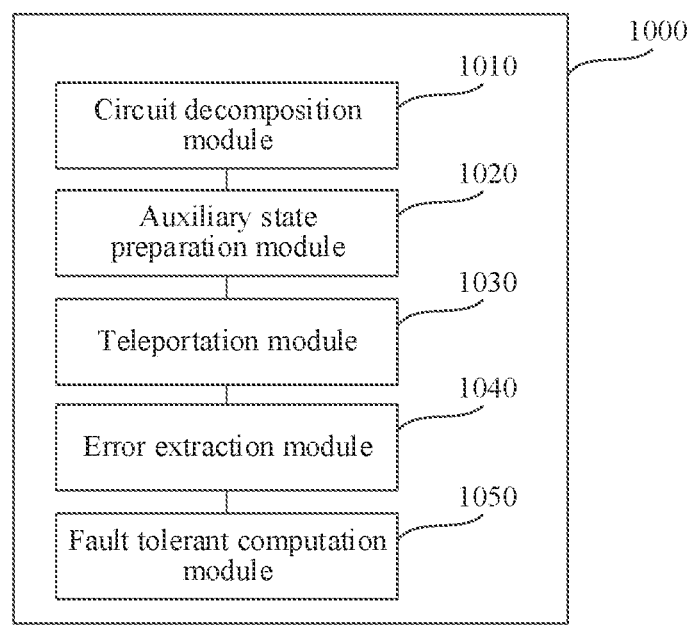
FIG. 10 is an example block diagram of a fault tolerant computation apparatus for a quantum Clifford circuit according to another embodiment of this application.

FIG. 10 is a block diagram of a fault tolerant computation apparatus for a quantum Clifford circuit according to an embodiment of this application. The apparatus has functions of implementing the foregoing method examples. The functions may be implemented by using hardware, or may be implemented by hardware executing corresponding software. The apparatus may be a computer device, or may be disposed in a computer device. The apparatus 1000 may include a circuit decomposition module 1010, an auxiliary state preparation module 1020, a teleportation module 1030, an error extraction module 1040, and a fault tolerant computation module 1050. The term module is used to refer to any collection of software, hardware or combination of software and hardware that are configured to achieve a particular functionality.

The circuit decomposition module 1010 is configured to decompose a quantum Clifford circuit into s logic Clifford circuits, s being a positive integer.

The auxiliary state preparation module 1020 is configured to prepare auxiliary states that respectively correspond to the s logic Clifford circuits.

The teleportation module 1030 is configured to: for an $i^{th}$ logic Clifford circuit in the s logic Clifford circuits, teleport an input state corresponding to the $i^{th}$ logic Clifford circuit to an auxiliary qubit, and process a quantum state obtained after the teleportation by the $i^{th}$ logic Clifford circuit to obtain an output state corresponding to the $i^{th}$ logic Clifford circuit, i being a positive integer less than or equal to s.

The error extraction module 1040 is configured to measure an error symptom corresponding to the $i^{th}$ logic Clifford circuit based on the input state and the auxiliary state that correspond to the $i^{th}$ logic Clifford circuit during the teleportation.

The fault tolerant computation module 1050 is configured to perform error correction on the output state corresponding to the $i^{th}$ logic Clifford circuit according to the error symptom corresponding to the $i^{th}$ logic Clifford circuit, to obtain an output state after fault tolerant computation.

To summarize, in the technical solution provided in the embodiments of this application, a quantum Clifford circuit is decomposed into a limited constant number of logic Clifford circuits, auxiliary states that respectively correspond to the logic Clifford circuits are prepared, an input state is teleported and processed by the logic Clifford circuit to obtain a corresponding output state, an error symptom corresponding to the logic Clifford circuit is measured based on the input state and the auxiliary state during the teleportation, and error correction is then performed on the output state according to the error symptom to obtain an output state after fault tolerant computation. In the foregoing manner, an implementation solution of a teleportation-based logic gate is used, so that fewer physical qubits and physical quantum gates are used while fault tolerant computation of a quantum Clifford circuit is efficiently implemented.

In an exemplary embodiment, the error extraction module 1040 is configured to:

process the input state and the auxiliary state that correspond to the $i^{th}$ logic Clifford circuit by using a CNOT gate;

measure a physical qubit corresponding to the input state in Pauli-Z direction, and measure a physical qubit corresponding to the auxiliary state in Pauli-X direction, to obtain a measurement result; and determine the error symptom corresponding to the $i^{th}$ logic Clifford circuit based on the measurement result.

In an exemplary embodiment, the fault tolerant computation module 1050 is configured to:

determine, based on the measurement result, a logic Pauli-X operator and a logic Pauli-Z operator that need to be corrected; and determine an occurrence position and a type of an error based on the error symptom corresponding to the $i^{th}$ logic Clifford circuit and by using a decoding algorithm corresponding to a quantum error correction (QEC) code, perform the error correction on the output state corresponding to the $i^{th}$ logic Clifford circuit, and obtain the output state after the fault tolerant computation after the logic Pauli-X operator and the logic Pauli-Z operator that need to be corrected are corrected.

In an exemplary embodiment, the auxiliary state preparation module 1020 is configured to:

determine the auxiliary states that respectively correspond to the s logic Clifford circuits;

build fault tolerant preparation circuits that respectively correspond to the auxiliary states; and prepare the auxiliary states by using the fault tolerant preparation circuits in parallel in a pipeline manner.

In an exemplary embodiment, s is less than or equal to 9.

In an exemplary embodiment, the logic Clifford circuit is a circuit that only includes a single-type gate, and the single-type gate includes any one of a CNOT gate, a Hadamard gate, and a phase gate.

In an exemplary embodiment, the auxiliary state includes at least one of the following: an auxiliary state corresponding to the CNOT gate, an auxiliary state corresponding to the Hadamard gate, and an auxiliary state corresponding to the phase gate.

In an exemplary embodiment, the circuit decomposition module 1010 is configured to:

transform the quantum Clifford circuit into a form of a symplectic matrix, to obtain a symplectic matrix representation of the quantum Clifford circuit; and decompose the symplectic matrix representation of the quantum Clifford circuit, to obtain symplectic matrix representations of the s logic Clifford circuits.

When the apparatus provided in the foregoing embodiments implements functions of the apparatus, it is illustrated with an example of division of each functional module. In the practical application, the functions may be implemented by different functional modules according to the requirements, that is, the internal structure of the device is divided into different functional modules, to implement all or some of the functions described above. In addition, the example apparatus and method embodiments provided in the foregoing embodiments belong to one conception. For the specific implementation process, reference may be made to the method embodiments, and details are not described herein again.

Figure 11:
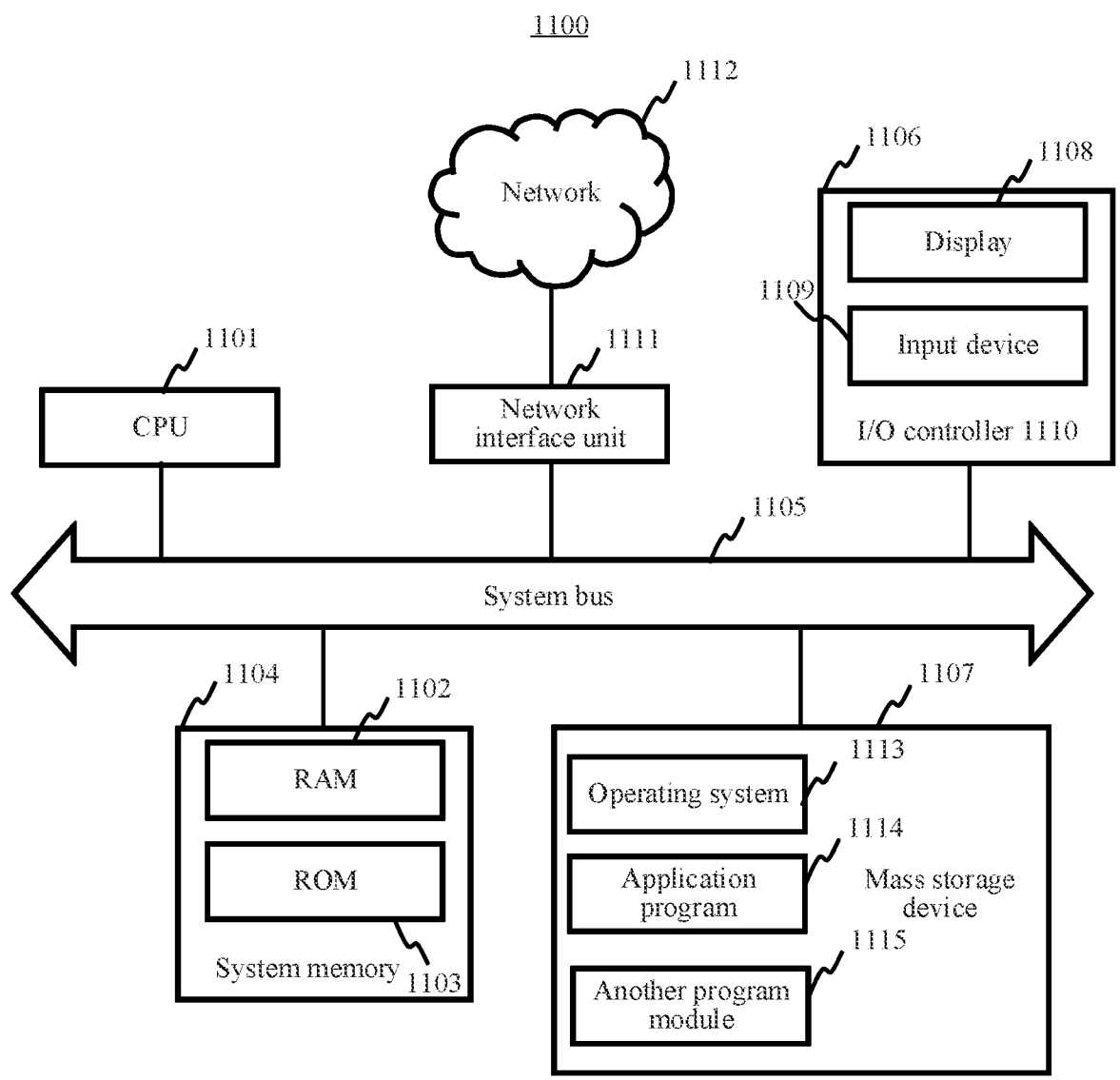
FIG. 11 is an example schematic structural diagram of a computer device according to an embodiment of this application.

FIG. 11 is a schematic structural diagram of a computer device according to an embodiment of this application. The computer device is configured to implement the fault tolerant computation method for a quantum Clifford circuit provided in the foregoing embodiments. For example, the computer device may include a classic computer. Details are as follows:

The computer device 1100 includes a central processing unit (CPU) 1101, a system memory 1104 including a random access memory (RAM) 1102 and a read-only memory (ROM) 1103, and a system bus 1105 connecting the system memory 1104 to the CPU 1101. The computer device 1100 further includes a basic input/output (I/O) system 1106 configured to transmit information between components in a computer, and a mass storage device 1107 configured to store an operating system 1113, an application program 1114, and another program module 1115.

The basic I/O system 1106 includes a display 1108 configured to display information, and an input device 1109 used by a user to input information, such as a mouse or a keyboard. The display 1108 and the input device 1109 are both connected to the CPU 1101 by using an input/output controller 1110 connected to the system bus 1105. The basic I/O system 1106 may further include the input/output controller 1110, to receive and process inputs from multiple other devices, such as the keyboard, the mouse, or an electronic stylus. Similarly, the input/output controller 1110 further provides an output to a display screen, a printer or another type of output device.

The mass storage device 1107 is connected to the central processing unit 1101 by using a mass storage controller (not shown) connected to the system bus 1105. The mass storage device 1107 and an associated computer-readable medium provide non-volatile storage for the computer device 1100. That is, the mass storage device 1107 may include a computer-readable medium (not shown) such as a hard disk or a compact disc ROM (CD-ROM) drive.

Without loss of generality, the computer readable medium may include a computer storage medium and a information-transporting medium. The computer storage medium includes volatile and non-volatile media, and removable and non-removable media implemented by using any method or technology and configured to store information such as a computer-readable instruction, a data structure, a program module, or other data. The computer storage medium includes a RAM, a ROM, an erasable programmable ROM (EPROM), an electrically erasable programmable ROM (EEPROM), a flash memory or another solid-state memory technology, a CD-ROM, a digital versatile disc (DVD) or another optical memory, a tape cartridge, a magnetic cassette, a magnetic disk memory, or another magnetic storage device. A person of ordinary skill in the art understands that the computer storage medium is not limited to the foregoing types. The system memory 1104 and the mass storage device 1107 may be collectively referred to as a memory.

According to the embodiments of this application, the computer device 1100 may further be connected, through a network such as the Internet, to a remote computer on the network. That is, the computer device 1100 may be connected to a network 1112 by using a network interface unit 1111 connected to the system bus 1105, or may be connected to another type of network or a remote computer system (not shown) by using a network interface unit 1111.

The memory stores at least one instruction, at least one section of program, a code set, or an instruction set, and the at least one instruction, the at least one section of program, the code set, or the instruction set is configured to be executed by one or more processors to implement the foregoing fault tolerant computation method for a quantum Clifford circuit.

In an exemplary embodiment, a computer-readable storage medium is further provided, the storage medium storing at least one instruction, at least one program, a code set or an instruction set, and the at least one instruction, the at least one program, the code set or the instruction set being executed by the processor of a computer device to implement the foregoing fault tolerant computation method for a quantum Clifford circuit. In an exemplary embodiment, the computer-readable storage medium may be a ROM, a RAM, a CD-ROM, a magnetic tape, a floppy disk, an optical data storage device.

In an exemplary embodiment, a computer program product is further provided, when executed, the computer program product being used for performing the fault tolerant computation method for a quantum Clifford circuit provided in the foregoing embodiments.

"Plurality of" mentioned in the specification means two or more. "And/or" describes an association relationship for describing associated objects and represents that three relationships may exist. For example, A and/or B may represent the following three cases: Only A exists, both A and B exist, and only B exists. The character "/" in this specification generally indicates an "or" relationship between the associated objects. In addition, the step numbers described in this specification merely exemplarily show a possible execution sequence of the steps. In some other embodiments, the steps may not be performed according to the number sequence. For example, two steps with different numbers may be performed simultaneously, or two steps with different numbers may be performed according to a sequence contrary to the sequence shown in the figure. This is not limited in the embodiments of this application.

The foregoing descriptions are merely exemplary embodiments of this application, but are not intended to limit this application. Any modification, equivalent replacement, or improvement made within the spirit and principle of this application shall fall within the protection scope of this application.

What is claimed is:

1. A fault tolerant computation method for a quantum Clifford circuit, the method comprising:
    decomposing a quantum Clifford circuit into s logic Clifford circuits, s being a positive integer;
    preparing auxiliary quantum states corresponding to the s logic Clifford circuits; and
    for an $i^{th}$ logic Clifford circuit of the s logic Clifford circuits, i being a positive integer less than or equal to s:
        teleporting an input quantum state corresponding to the $i^{th}$ logic Clifford circuit to an auxiliary qubit corresponding to the $i^{th}$ logic Clifford circuit;
        processing a quantum state obtained after the teleportation by the $i^{th}$ logic Clifford circuit to obtain an output quantum state corresponding to the $i^{th}$ logic Clifford circuit;
        measuring an error symptom corresponding to the $i^{th}$ logic Clifford circuit based on the input quantum state and the auxiliary quantum state that correspond to the $i^{th}$ logic Clifford circuit during the teleportation; and
        performing error correction on the output quantum state corresponding to the $i^{th}$ logic Clifford circuit according to the error symptom corresponding to the $i^{th}$ logic Clifford circuit, to obtain an error-corrected output quantum state.

2. The method according to claim 1, wherein measuring the error symptom corresponding to the $i^{th}$ logic Clifford circuit based on the input quantum state and the auxiliary quantum state that correspond to the $i^{th}$ logic Clifford circuit comprises:
    processing the input quantum state and the auxiliary quantum state that correspond to the $i^{th}$ logic Clifford circuit by using a controlled NOT (CNOT) gate;
    measuring a physical qubit corresponding to the input quantum state in Pauli-Z direction, and measuring a physical qubit corresponding to the auxiliary quantum state in Pauli-X direction, to obtain a measurement result; and
    determining the error symptom corresponding to the $i^{th}$ logic Clifford circuit based on the measurement result.

3. The method according to claim 2, wherein performing the error correction on the output quantum state corresponding to the $i^{th}$ logic Clifford circuit according to the error symptom corresponding to the $i^{th}$ logic Clifford circuit, to obtain the error-corrected output quantum state comprises:
    determining, based on the measurement result, a logic Pauli-X operator and a logic Pauli-Z operator that need to be error-corrected;
    determining an occurrence position and a type of an error based on the error symptom corresponding to the $i^{th}$ logic Clifford circuit and by using a decoding algorithm corresponding to a quantum error correction (QEC) code; and
    performing the error correction on the output quantum state corresponding to the $i^{th}$ logic Clifford circuit to obtain the error-corrected output quantum state after the logic Pauli-X operator and the logic Pauli-Z operator that need to be error corrected are corrected.

4. The method according to claim 1, wherein preparing the auxiliary quantum states corresponding to the s logic Clifford circuits comprises:
    determining the auxiliary quantum states corresponding to the s logic Clifford circuits;
    building fault tolerant preparation circuits corresponding to the auxiliary quantum states; and
    preparing the auxiliary quantum states by using the fault tolerant preparation circuits in parallel in a pipelined manner.

5. The method according to claim 1, wherein s is less than or equal to 9.

6. The method according to claim 1, wherein the $i^{th}$ logic Clifford circuit comprises a single-type gate, and the single-type gate comprises any one of a controlled NOT (CNOT) gate, a Hadamard gate, or a phase gate.

7. The method according to claim 6, wherein the auxiliary quantum state corresponding to the $i^{th}$ logic Clifford circuit comprises at least one of the following: an auxiliary quantum state corresponding to the CNOT gate, an auxiliary quantum state corresponding to the Hadamard gate, and an auxiliary quantum state corresponding to the phase gate.

8. The method according to claim 1, wherein decomposing the quantum Clifford circuit into s logic Clifford circuits comprises:
  transforming the quantum Clifford circuit into a form of a symplectic matrix to obtain a symplectic matrix representation of the quantum Clifford circuit; and
  decomposing the symplectic matrix representation of the quantum Clifford circuit to obtain symplectic matrix representations of the s logic Clifford circuits.

9. A fault tolerant computation device for a quantum Clifford circuit comprising a memory for storing instructions and a processor for executing the instructions to:
  decompose a quantum Clifford circuit into s logic Clifford circuits, s being a positive integer;
  prepare auxiliary quantum states corresponding to the s logic Clifford circuits; and
  for an $i^{th}$ logic Clifford circuit of the s logic Clifford circuits corresponding to the $i^{th}$ logic Clifford circuit, i being a positive integer less than or equal to s:
    teleport an input quantum state corresponding to the $i^{th}$ logic Clifford circuit to an auxiliary qubit;
    process a quantum state obtained after the teleportation by the $i^{th}$ logic Clifford circuit to obtain an output quantum state corresponding to the $i^{th}$ logic Clifford circuit;
    measure an error symptom corresponding to the $i^{th}$ logic Clifford circuit based on the input quantum state and the auxiliary quantum state that correspond to the $i^{th}$ logic Clifford circuit during the teleportation; and
    perform error correction on the output quantum state corresponding to the $i^{th}$ logic Clifford circuit according to the error symptom corresponding to the $i^{th}$ logic Clifford circuit, to obtain an error-corrected output quantum state.

10. The fault tolerant computation device according to claim 9, wherein to measure the error symptom corresponding to the $i^{th}$ logic Clifford circuit based on the input quantum state and the auxiliary quantum state that correspond to the $i^{th}$ logic Clifford circuit, the processor is configured to execute the instructions to:
  process the input quantum state and the auxiliary quantum state that correspond to the $i^{th}$ logic Clifford circuit by using a controlled NOT (CNOT) gate;
  measure a physical qubit corresponding to the input quantum state in Pauli-Z direction, and measuring a physical qubit corresponding to the auxiliary quantum state in Pauli-X direction, to obtain a measurement result; and
  determine the error symptom corresponding to the $i^{th}$ logic Clifford circuit based on the measurement result.

11. The fault tolerant computation device according to claim 10, wherein to perform the error correction on the output quantum state corresponding to the $i^{th}$ logic Clifford circuit according to the error symptom corresponding to the $i^{th}$ logic Clifford circuit, to obtain the error-corrected output quantum state, the processor is configured to execute the instructions to:
  determine, based on the measurement result, a logic Pauli-X operator and a logic Pauli-Z operator that need to be error-corrected;
  determine an occurrence position and a type of an error based on the error symptom corresponding to the $i^{th}$ logic Clifford circuit and by using a decoding algorithm corresponding to a quantum error correction (QEC) code; and
  perform the error correction on the output quantum state corresponding to the $i^{th}$ logic Clifford circuit to obtain the error-corrected output quantum state after the logic Pauli-X operator and the logic Pauli-Z operator that need to be error corrected are corrected.

12. The fault tolerant computation device according to claim 9, wherein to prepare the auxiliary quantum states corresponding to the s logic Clifford circuits, the processor is configured to execute the instructions to:
  determine the auxiliary quantum states corresponding to the s logic Clifford circuits;
  build fault tolerant preparation circuits corresponding to the auxiliary quantum states; and
  prepare the auxiliary quantum states by using the fault tolerant preparation circuits in parallel in a pipelined manner.

13. The fault tolerant computation device according to claim 9, wherein s is less than or equal to 9.

14. The fault tolerant computation device according to claim 9, wherein the $i^{th}$ logic Clifford circuit comprises a single-type gate, and the single-type gate comprises any one of a controlled NOT (CNOT) gate, a Hadamard gate, or a phase gate.

15. The fault tolerant computation device according to claim 14, wherein the auxiliary quantum state corresponding to the $i^{th}$ logic Clifford circuit comprises at least one of the following: an auxiliary quantum state corresponding to the CNOT gate, an auxiliary quantum state corresponding to the Hadamard gate, and an auxiliary quantum state corresponding to the phase gate.

16. The fault tolerant computation device according to claim 9, wherein to decompose the quantum Clifford circuit into s logic Clifford circuits, the processor is configured to execute the instructions to:
  transform the quantum Clifford circuit into a form of a symplectic matrix to obtain a symplectic matrix representation of the quantum Clifford circuit; and
  decompose the symplectic matrix representation of the quantum Clifford circuit to obtain symplectic matrix representations of the s logic Clifford circuits.

17. The fault tolerant computation device according to claim 9, wherein the processor comprises a superconducting quantum computation (QC) chip.

18. The fault tolerant computation device according to claim 17, wherein:
  the superconducting QC chip comprises m layer of physical qubits having a three-dimensional integrated packaging, m being an integer greater than 1;
  each layer of physical qubits being used for forming a quantum state, the quantum state comprising any one of the input quantum state, the auxiliary quantum state, and the output quantum state; and
  physical qubits at the same position in different layers are coupled by a data bus.

19. The fault tolerant computation device of claim 18, wherein for the physical qubits at the same position in different layers, the data bus is formed by using a deep through-silicon via technology to couple the physical qubits.

20. A non-transitory computer-readable storage medium, storing at least one instruction, at least one program, a code set or an instruction set, and the at least one instruction, the at least one program, the code set or the instruction set, when being loaded and executed by a processor, is configure to cause the processor to:
- decompose a quantum Clifford circuit into s logic Clifford circuits, s being a positive integer;
- prepare auxiliary quantum states corresponding to the s logic Clifford circuits; and
- for an $i^{th}$ logic Clifford circuit of the s logic Clifford circuits corresponding to the $i^{th}$ logic Clifford circuit, i being a positive integer less than or equal to s:
  - teleport an input quantum state corresponding to the $i^{th}$ logic Clifford circuit to an auxiliary qubit;
  - process a quantum state obtained after the teleportation by the $i^{th}$ logic Clifford circuit to obtain an output quantum state corresponding to the $i^{th}$ logic Clifford circuit;
  - measure an error symptom corresponding to the $i^{th}$ logic Clifford circuit based on the input quantum state and the auxiliary quantum state that correspond to the $i^{th}$ logic Clifford circuit during the teleportation; and
  - perform error correction on the output quantum state corresponding to the $i^{th}$ logic Clifford circuit according to the error symptom corresponding to the $i^{th}$ logic Clifford circuit, to obtain an error-corrected output quantum state.

* * * * *